(12) United States Patent
Yoo

(10) Patent No.: US 10,593,699 B2
(45) Date of Patent: Mar. 17, 2020

(54) FERROELECTRIC MEMORY DEVICE

(71) Applicant: SK hynix Inc., Icheon (KR)

(72) Inventor: Hyangkeun Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 15/839,849

(22) Filed: Dec. 13, 2017

(65) Prior Publication Data

US 2018/0277550 A1    Sep. 27, 2018

(30) Foreign Application Priority Data

Mar. 21, 2017 (KR) .................. 10-2017-0035343

(51) Int. Cl.
| | | |
|---|---|---|
| *H01L 27/115* | (2017.01) | |
| *H01L 27/1159* | (2017.01) | |
| *H01L 29/51* | (2006.01) | |
| *G11C 11/22* | (2006.01) | |
| *H01L 29/49* | (2006.01) | |
| *H01L 29/78* | (2006.01) | |

(52) U.S. Cl.
CPC ........ *H01L 27/1159* (2013.01); *G11C 11/223* (2013.01); *G11C 11/2275* (2013.01); *H01L 29/4958* (2013.01); *H01L 29/513* (2013.01); *H01L 29/516* (2013.01); *H01L 29/517* (2013.01); *H01L 29/78391* (2014.09)

(58) Field of Classification Search
CPC ......... H01L 27/11507; H01L 27/11502; H01L 28/55; H01L 29/78391; H01L 29/516
See application file for complete search history.

(56) References Cited

U.S. PATENT DOCUMENTS

| | | | |
|---|---|---|---|
| 7,034,349 B2 | 4/2006 | Dimmler et al. | |
| 7,297,602 B2 | 11/2007 | Hsu et al. | |
| 2017/0338350 A1* | 11/2017 | Flachowsky | ...... H01L 21/28291 |

* cited by examiner

*Primary Examiner* — Tony Tran

(57) ABSTRACT

A ferroelectric memory device includes a substrate, a ferroelectric structure having a first ferroelectric material layer, an electrical floating layer, and a second ferroelectric material layer sequentially stacked on the substrate, and a gate electrode layer disposed on the ferroelectric structure. A hysteresis loop of the second ferroelectric material layer differs from a hysteresis loop of the first ferroelectric material layer.

7 Claims, 11 Drawing Sheets

FERROELECTRIC MEMORY DEVICE

CROSS-REFERENCE TO RELATED APPLICATION

The present application claims priority under 35 U.S.C. 119(a) to Korean Patent Application No. 10-2017-0035343, filed on Mar. 21, 2017, which is herein incorporated by reference in its entirety.

BACKGROUND

1. Technical Field

Embodiments of the present disclosure relate to a ferroelectric memory device.

2. Related Art

Generally, a ferroelectric material refers to a material having spontaneous electrical polarization in the absence of an applied external electric field. In addition, a ferroelectric material can be controlled by an externally applied electric field to maintain either of two stable remanent polarization states on a hysteresis curve. Thus, a ferroelectric material may be utilized to store logic information of "0" or "1" in a nonvolatile manner.

Recently, a technique has been studied for storing a plurality of levels of logic information that can be differentiated by changing a fraction of a switchable domain region in a ferroelectric material, through adjustment of a magnitude of an external electric field. In order for the technique to be effectively used in a nonvolatile memory device having a plurality of ferroelectric memory cells, a target memory cell should reliably maintain a partially switched polarization orientation state, during a read operation of the target memory cell or a write operation of a memory cell adjacent to the target memory cell.

SUMMARY

A ferroelectric memory device according to an aspect of the present disclosure includes a substrate, a ferroelectric structure having a first ferroelectric material layer, an electrical floating layer, and a second ferroelectric material layer that are sequentially stacked or disposed on the substrate, and a gate electrode layer disposed on the ferroelectric structure. A hysteresis loop of the second ferroelectric material layer differs from a hysteresis loop of the first ferroelectric material layer.

A ferroelectric memory device according to another aspect of the present disclosure includes a substrate having a source region and a drain region. In addition, the ferroelectric memory device includes a ferroelectric structure having a first ferroelectric material layer, an electrical floating layer, and a second ferroelectric material layer that are sequentially stacked or disposed on the substrate. Further, the ferroelectric memory device includes a gate electrode layer disposed on the second ferroelectric material layer. A coercive electric field of the first ferroelectric material layer is different from that of the second ferroelectric material layer. The electrical floating layer comprises a conductive material.

DETAILED DESCRIPTION

Figure 1:
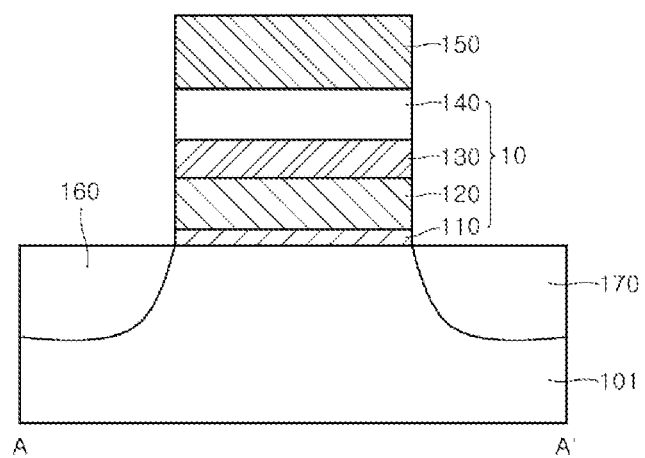
FIG. 1 is a cross-sectional view schematically illustrating the ferroelectric memory device.

Various embodiments will now be described hereinafter with reference to the accompanying drawings. In the drawings, the dimensions of layers and regions may be exaggerated for clarity of illustration. The drawings are described with respect to an observer's viewpoint. If a first element is referred to be located on a second element, it may be understood that the first element is directly located on the second element; that an additional element may be interposed between the first element and the second element; or that a portion of the first element is directly located on a portion of the second element. The same reference numerals may refer to the same elements throughout the specification.

In addition, expression of a singular form of a word includes the plural forms of the word unless clearly used otherwise in the context of the disclosure. The terms "comprise", "have", or "include" are intended to specify the presence of a feature, a number, a step, an operation, an element, a component, a part, or combinations thereof, but the terms do not preclude the presence or possibility of the addition of one or more other features, numbers, steps, operations, elements, components, parts, or combinations thereof.

Further, each step or process in a method or a manufacturing method need not be performed in any order set forth in the disclosure unless a specific sequence is explicitly described. In other words, each step or process in a method or manufacturing method disclosed herein may be performed sequentially in the stated order, may be performed out of sequence from the stated order, or may be performed substantially at the same time as one or more other steps or processes. The steps or processes may also be performed in a reverse order.

FIG. 1 is a cross-sectional view schematically illustrating a ferroelectric memory device 1 according to an embodiment of the present disclosure. Referring to FIG. 1, in an embodiment, a ferroelectric memory device 1 may include a substrate 101 and a ferroelectric structure 10 disposed on the substrate 101. The ferroelectric structure 10 may include a first ferroelectric material layer 120, an electrical floating layer 130, and a second ferroelectric material layer 140 that are sequentially stacked or disposed on the substrate 101. In addition, the ferroelectric structure 10 may further include an interfacial insulation layer 110 disposed between the substrate 101 and the first ferroelectric material layer 120. The ferroelectric memory device 1 may be a transistor type device with a channel resistance that differs depending on the polarization orientation of the first and second ferroelectric material layers 120 and 140.

The substrate 101 may, for example, include a semiconductor material. The substrate 101 may be a silicon (Si) substrate, a gallium arsenide (GaAs) substrate, an indium phosphide (InP) substrate, a germanium (Ge) substrate, or a silicon germanium (SiGe) substrate, as non-limiting examples. In an embodiment, the substrate 101 may be doped to have conductivity. As an example, the substrate 101 may be doped with p-type impurities. As another example, the substrate 101 may have at least one region doped with p-type impurities.

A source region 160 and a drain region 170 may be disposed in the substrate 101 at respective ends or sides of the ferroelectric structure 10, and formed in an upper portion of substrate 101. In an embodiment, the source region 160 and the drain region 170 may be p-type doped regions in the substrate 101.

The interfacial insulation layer 110 may be disposed on the substrate 101. The interfacial insulation layer 110 may function to suppress material diffusion between the substrate 101 and the first ferroelectric material layer 120. The interfacial insulation layer 110 may also function to suppress the transfer of electric charges from a channel of the substrate 101 to the first ferroelectric insulation layer 120 during a read operation of the ferroelectric memory device 1. In some embodiments, the interfacial insulation layer 110 may be omitted.

The first ferroelectric material layer 120 may be disposed on the interfacial insulation layer 110. The first ferroelectric material layer 120 may include a ferroelectric material having remanent polarization therein. The remanent polarization can induce electrons as conductive carriers in the substrate 101 below the first ferroelectric material layer 120. A channel resistance of the ferroelectric memory device 1 may be determined depending on the density of the induced electrons.

In an embodiment, the first ferroelectric material layer 120 may include a metal oxide. The first ferroelectric material layer 120 may include a hafnium oxide, a zirconium oxide, a hafnium zirconium oxide, or a combination thereof, as non-limiting examples. In an embodiment, the first ferroelectric material layer 120 may include at least one dopant. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, as non-limiting examples.

In another embodiment, the first ferroelectric material layer 120 may include a material having a perovskite crystalline structure. The first ferroelectric material layer 120 may include a lead zirconium titanium oxide (Pb[$Zr_x Ti_{1-x}$]$O_3$ 0<x<1, PZT), a barium titanium oxide ($BaTiO_3$), or the like, as non-limiting examples.

The electrical floating layer 130 may be disposed on the first ferroelectric material layer 120. The electrical floating layer 130 may include a conductive material. The conductive material may include metal, a metal nitride, a metal oxide, a metal silicide, a doped semiconductor, or a combination of two or more thereof, as non-limiting examples. Specifically, the electrical floating layer 130 may include a tungsten layer, a titanium layer, a copper layer, an aluminum layer, a platinum layer, an iridium layer, a ruthenium layer, a tungsten nitride layer, a titanium nitride layer, a tantalum nitride layer, an iridium oxide layer, a ruthenium oxide layer, a tungsten carbide layer, a titanium carbide layer, a tungsten silicide layer, a titanium silicide layer, a tantalum silicide layer, an n-type doped silicon layer, or the like, as non-limiting examples.

Electrons in the electrical floating layer 130 can be induced to collect at different densities at regions of the electrical floating layer 130 interfacing with, or adjacent to, the first ferroelectric material layer 120 and the second ferroelectric material layer 140. The electron densities depend on the degree of polarization orientation of the first ferroelectric material layer 120 and the second ferroelectric material layer 140.

The second ferroelectric material layer 140 may be disposed on the electrical floating layer 130. The second ferroelectric material layer 140 may have a different ferroelectric property from the first ferroelectric material layer 120. As described below with reference to FIG. 2, a hysteresis loop of the second ferroelectric material layer 140 may differ from a hysteresis loop of the first ferroelectric material layer 120. As an example, a coercive electric field of the first ferroelectric material layer is different from that of the second ferroelectric material layer. As another example, an absolute value of the coercive electric field of the second ferroelectric material layer 140 may be greater than an absolute value of the coercive electric field of the first ferroelectric material layer 120.

In an embodiment, the second ferroelectric material layer 140 may include a metal oxide. In an embodiment, the second ferroelectric material layer 140 may include a different metal oxide from a metal oxide of the first ferroelectric material layer 120. The second ferroelectric material layer 140 may include at least one kind of dopant. In another embodiment, the first ferroelectric material layer 120 and the second ferroelectric material layer 140 may include the same metal oxides, but may each have different dopants. The second ferroelectric material layer 140 may include at least one of a hafnium oxide, a zirconium oxide, a hafnium zirconium oxide, as non-limiting examples. The dopant may include carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), lanthanum (La), or a combination of two or more thereof, as non-limiting examples.

In another embodiment, the second ferroelectric material layer 140 may include a material having a perovskite crystalline structure. The second ferroelectric material layer 140 may include a lead zirconium titanium oxide (Pb[$Zr_x Ti_{1-x}$]$O_3$ 0<x<1, PZT), a barium titanium oxide ($BaTiO_3$), or the like, as non-limiting examples. The second ferroelectric material layer 140 may have a different ferroelectric material than that of the first ferroelectric material layer 120.

The gate electrode layer 150 may be disposed on the second ferroelectric material layer 140. The gate electrode layer 150 may include a conductive material. The gate electrode layer 150 may include tungsten (W), titanium (Ti), copper (Cu), aluminum (Al), platinum (Pt), iridium (Ir), ruthenium (Ru), a tungsten nitride, a titanium nitride, a tantalum nitride, an iridium oxide, a ruthenium oxide, a tungsten carbide, a titanium carbide, a tungsten silicide, a titanium silicide, a tantalum silicide, or a combination of two or more thereof, as non-limiting examples.

According to an embodiment, a write operation to the ferroelectric memory device 1 may be performed by controlling the polarization orientation of the second ferroelectric material layer 140 using a write voltage applied to the gate electrode layer 150. The polarization orientation state of the second ferroelectric material layer 140 can be adjusted to a plurality of levels by changing the write voltage. In an embodiment, a method of adjusting the polarization orientation state to a plurality of levels may include changing the fraction of the domain region having a polarization that is oriented in the same direction by changing a magnitude of the write voltage or an application condition, such as an application time, or a duration, of an applied predetermined write voltage as described with reference to FIG. 7. As an example, the second ferroelectric material layer 140 may have two polarization orientations: a first polarization orientation in upward orientation and a second polarization orientation in a downward orientation. It is possible to write a plurality of levels of polarization orientation states by changing the fraction or portion, in the second ferroelectric material layer 140, of the domain region having the first polarization orientation and the domain region having the second polarization orientation. Multiple combinations of fractions or portions of domain regions with different polarization orientations in the second ferroelectric material layer can be contemplated. As a result, a plurality of levels, and at least two levels, of logic information can be written in the second ferroelectric material layer 140.

When the polarization orientation state of the second ferroelectric material layer 140 corresponds to one of the plurality of levels, according to the one of the plurality of levels, the density of electrons induced to collect at a region of the second ferroelectric material layer 140 interfacing with, or adjacent to, the electrical floating layer 130 can be determined or measured. Then, the hysteresis loop of the first ferroelectric material layer 120 can be changed by the determined electron density of the second ferroelectric material layer 140.

In an embodiment, a read operation for the ferroelectric memory device 1 may be performed by applying a predetermined gate voltage to the ferroelectric structure 10 and applying a predetermined read operation voltage between the source region 160 and drain region 170 to measure a current between the source region 160 and drain region 170. After that, the polarization characteristic of the ferroelectric structure 10 including the first ferroelectric material layer 120 and the second ferroelectric material layer 140 is determined based on the current measurement. The polarization characteristic of the ferroelectric structure 10 may be changed by the remanent polarization written in the second ferroelectric material layer 140. The read operation may be performed by applying a gate voltage within a range in which the polarization orientation state stored in the second ferroelectric material layer 140 is not changed. Accordingly, during the read operation, the remanent polarization stored in the target memory cell or the adjacent memory cell is not changed, so that a plurality of levels of logic information can be reliably stored.

Figure 2:
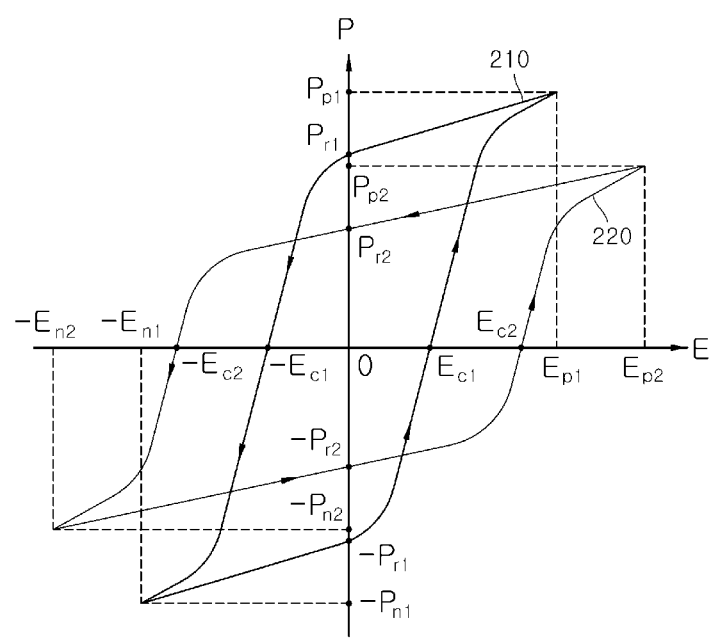
FIG. 2 is a graph schematically illustrating hysteresis loops of ferroelectric material layers according to an embodiment of the present disclosure.

FIG. 2 is a graph schematically illustrating hysteresis loops of ferroelectric material layers according to an embodiment of the present disclosure. Referring to FIG. 2, the first and second hysteresis loops 210 and 220 may correspond to the hysteresis loops of the first and second ferroelectric material layers 120 and 140, respectively, of the embodiment described above and with reference to FIG. 1.

Referring to the first hysteresis loop 210 of FIG. 2, the first ferroelectric material layer 120 may have a pair of remanent polarization $P_{r1}$, $-P_{r1}$ symmetrical to each other with respect to origin, and a pair of coercive electric fields $E_{c1}$, $-E_{c1}$ symmetrical to each other with respect to origin. The first ferroelectric material layer 120 may have a first and second saturation polarization $P_{p1}$, $-P_{n1}$ in a first and second saturation electric fields $E_{p1}$, $-E_{n1}$, respectively.

Similarly, referring to the second hysteresis loop 220 of FIG. 2, the second ferroelectric material layer 140 may have a pair of remanent polarization $P_{r2}$, $-P_{r2}$ symmetrical to each other with respect to origin, and a pair of coercive electric fields $E_{c2}$, $-E_{c2}$ symmetrical to each other with respect to origin. The second ferroelectric material layer 140 may have first and second saturation polarization $P_{p2}$, $-P_{n2}$ in the first and second saturation electric fields $E_{p2}$, $-E_{n2}$, respectively.

In an embodiment of the present disclosure, the absolute values of the coercive electric fields $E_{c2}$, $-E_{c2}$ of the second ferroelectric material layer 140 may be greater than the absolute values of the coercive electric fields $E_{c1}$, $-E_{c1}$ of the first ferroelectric material layer 120. As illustrated, the absolute values of the remanent polarizations $P_{r2}$, $-P_{r2}$ of the second ferroelectric material layer 140 may be smaller than the absolute values of the remanent polarizations $P_{r1}$, $-P_{r1}$ of the first ferroelectric material layer 120. In some other embodiments not illustrated, the absolute values of the coercive electric fields $E_{c2}$, $-E_{c2}$ of the second ferroelectric material layer 140 may be greater than the absolute values of the coercive electric fields $E_{c1}$, $-E_{c1}$ of the first ferroelectric material layer 120, and the absolute values of the remanent polarizations $P_{r2}$, $-P_{r2}$ of the second ferroelectric material layer may be equal to or greater than the absolute values of the remanent polarizations $P_{r1}$, $-P_{r1}$ of the first ferroelectric material layer 120.

FIGS. 3A, 4A, 5A and 6A are views of a portion of the ferroelectric memory device of FIG. 1, schematically illustrating operations writing a plurality of levels of logic information according to embodiments of the present disclosure. FIGS. 3B, 4B, 5B and 6B are hysteresis loops of the ferroelectric memory device corresponding to the write operations of FIGS. 3A, 4A, 5A and 6A, respectively.

The configuration of the ferroelectric memory devices illustrated in FIGS. 3A, 4A, 5A and 6A is substantially the same as the configuration of a ferroelectric memory device 1 described above and with reference to FIG. 1. FIGS. 3A, 4A, 5A and 6A schematically illustrate operations writing the polarization orientation in the second ferroelectric material layer 140. FIGS. 3B, 4B, 5B and 6B schematically illustrate hysteresis loops of the ferroelectric structure 10, which are changed depending on the remanent polarization orientation written in the second ferroelectric material layer 140 after completion of the write operations of FIGS. 3A, 4A, 5A and 6A.

Figure 3A:
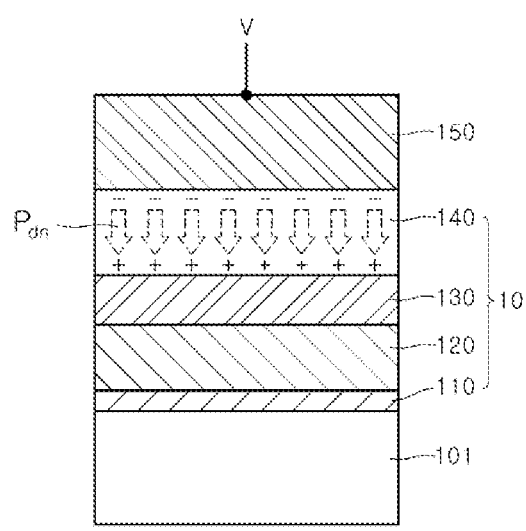
FIGS. 3A, 4A, 5A and 6A are views of a portion of the ferroelectric memory device of FIG. 1, schematically illustrating operations writing a plurality of levels of logic information according to embodiments of the present disclosure.

Referring to FIG. 3A, in an embodiment, a first write voltage may be applied to the ferroelectric structure 10 from a power supply V. The first write voltage changes the polarization orientation in the entire second ferroelectric material layer 140 to a first polarization orientation state having downward polarization $P_{dn}$. In an example, the first write voltage may correspond to an electric field greater than the coercive electric field $E_{c2}$ of the second hysteresis loop 220 described above and with reference to FIG. 2. As another example, the first write voltage may correspond to an electric field greater than the first saturation electric field $E_{p2}$ of the second hysteresis loop 220.

Figure 3B:
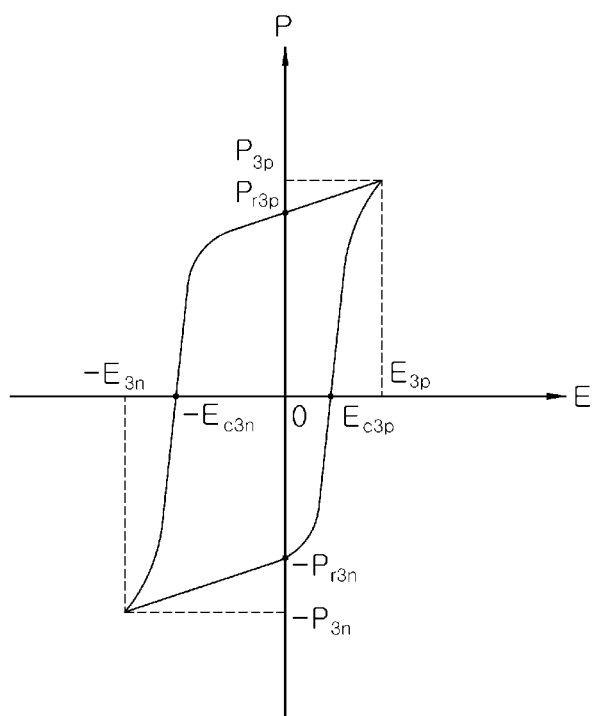
FIGS. 3B, 4B, 5B and 6B are hysteresis loops of the ferroelectric memory device corresponding to the write operations illustrated in FIGS. 3A, 4A, 5A and 6A, respectively.

Referring to FIG. 3B, there is illustrated a hysteresis loop of the ferroelectric structure 10 having predetermined coercive electric fields $E_{c3p}$, $-E_{c3n}$ and remanent polarization $P_{r3p}$, $-P_{r3n}$. Saturation polarization $P_{3p}$ and $-P_{3n}$ corresponding to the saturation electric fields $E_{3p}$, $-E_{3n}$ are illustrated on the hysteresis loop.

After the first write voltage is applied, if the second ferroelectric material layer 140 has the first polarization orientation state, then the hysteresis loop of the ferroelectric structure 10 may not be symmetrical with respect to the origin. The coercive electric field $E_{c3p}$ when a positive electric field is applied may be smaller than the absolute value of coercive electric field $-E_{c3n}$ when a negative electric field is applied. Further, the saturation electric field $E_{3p}$ when a positive electric field is applied may be smaller than the absolute value of saturation electric field $-E_{3n}$ when a negative electric field is applied. In other words, the first polarization orientation state of the second ferroelectric material layer 140 may assist in switching the polarization orientation of the first ferroelectric material layer 120 from upward polarization state to a downward polarization state.

Figure 4A:
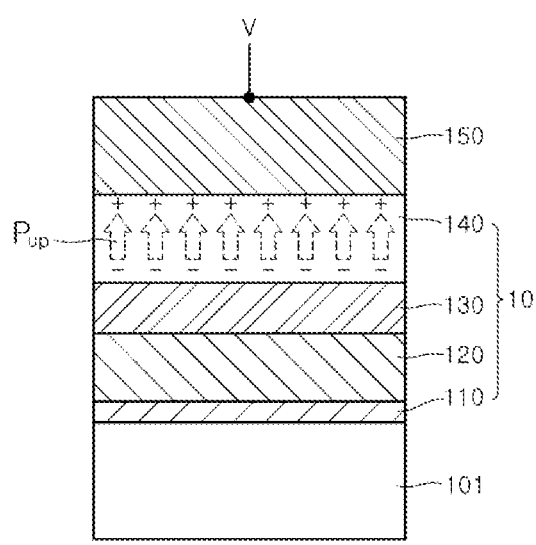

Referring to FIG. 4A, in an embodiment, a second write voltage may be applied to a ferroelectric structure 10 from a power supply V. The second write voltage changes the polarization orientation in the entire second ferroelectric material layer 140 to a second polarization orientation state having an upward polarization $P_{up}$. In an example, the second write voltage may correspond to a negative electric field having an absolute value greater than that of the coercive electric field $-E_{c2}$ of the second hysteresis loop 220 described above and with reference to FIG. 2. In another example, the second write voltage may correspond to a negative electric field having an absolute value greater than that of the second saturation electric field $-E_{n2}$ of the second hysteresis loop 220.

Figure 4B:
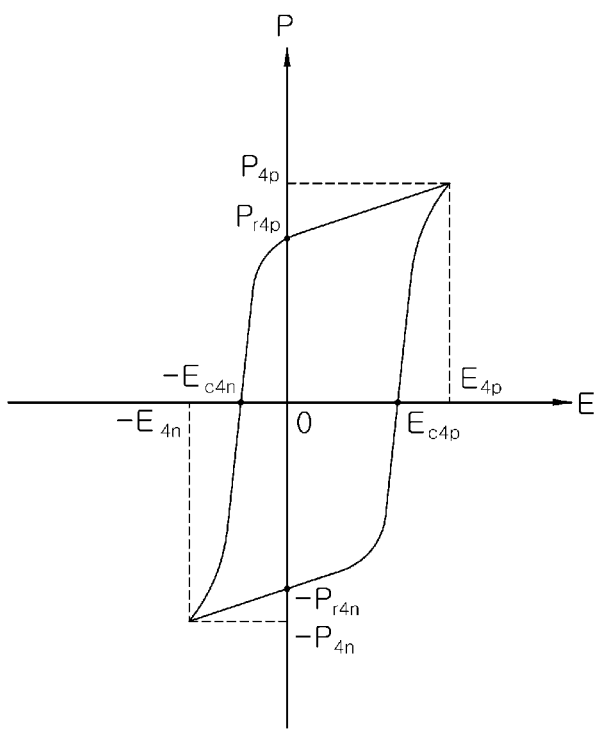

Referring to FIG. 4B, there is illustrated a hysteresis loop of the ferroelectric structure 10 having coercive electric fields $E_{c4p}$, $-E_{c4n}$ and remanent polarization $P_{r4p}$, $-P_{r4n}$. Saturation polarization $P_{4p}$, $-P_{4n}$ corresponding to the saturation electric fields $E_{4p}$, $-E_{4n}$ are illustrated on the hysteresis loop.

After the second write voltage is applied, if the second ferroelectric material layer 140 has the second polarization orientation state, then the hysteresis loop of the ferroelectric structure 10 may not be symmetrical with respect to the origin. The coercive electric field $E_{c4p}$ when a positive electric field is applied may be greater than the absolute value of coercive electric field $-E_{c4n}$ when a negative electric field is applied. Further, the saturation electric field $E_{4p}$ when a positive electric field is applied may be greater than the absolute value of saturation electric field $-E_{4n}$ when a negative electric field is applied. In other words, the orientation state (upward polarization $P_{up}$) of the second ferroelectric material layer 140 may prevent, suppress or impede the polarization orientation of the first ferroelectric material layer 120 from switching from an upward polarization state to a downward polarization state.

Figure 5A:
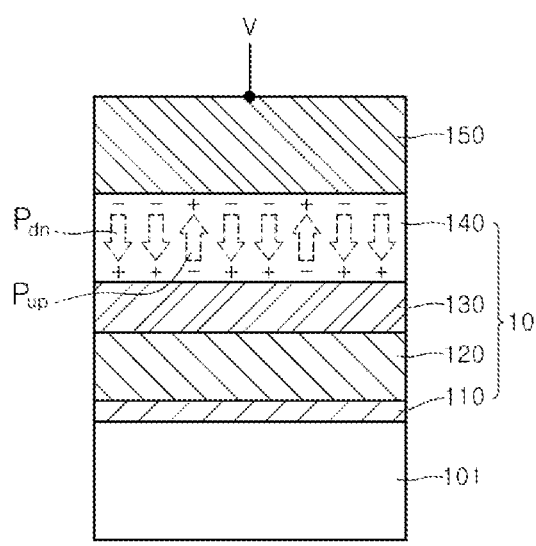

Referring to FIG. 5A, in an embodiment, a third write voltage may be applied to a ferroelectric structure 10 from the power supply V. The third write voltage changes the polarization orientation in the second ferroelectric material layer 140 to a third polarization orientation state having both a fraction or portion of the layer in an upward polarization $P_{up}$ and a fraction or portion of the layer in a downward polarization $P_{dn}$. However, in the third polarization orientation state, the fraction of the downward polarization $P_{dn}$ may be greater than the fraction of the upward polarization $P_{up}$. As an example, in the third polarization state, the domain region having an orientation state of the downward polarization $P_{dn}$ in the second ferroelectric material layer 140 may be greater than the domain region having an orientation state of the upward polarization $P_{up}$.

Figure 5B:
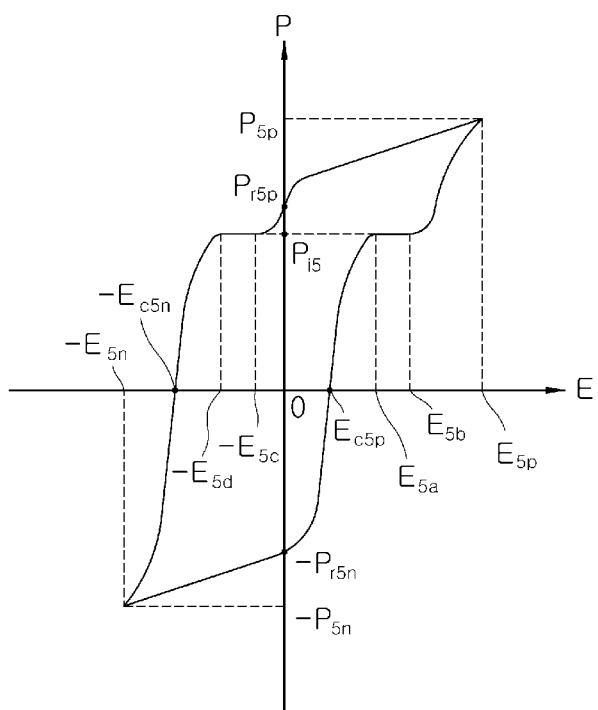

Referring to FIG. 5B, there is illustrated a hysteresis loop of the ferroelectric structure 10 having coercive electric fields $E_{c5p}$, $-E_{c5n}$ and remanent polarization $P_{r5p}$, $-P_{r5n}$. Saturation polarization $P_{5p}$, $-P_{5n}$ corresponding to the saturation electric fields $E_{5p}$, $-E_{5n}$ are illustrated on the hysteresis loop. When the second ferroelectric material layer 140 has the third polarization orientation state, the hysteresis loop of the ferroelectric structure 10 may not be symmetrical with respect to the origin.

Referring to FIG. 5B again, when a positive electric field with a value between $E_{5a}$ and $E_{5b}$ is applied, intermediate polarization $P_{i5}$ may be generated. The absolute value of the intermediate polarization $P_{i5}$ may be smaller than the absolute values of the remanent polarizations $P_{r5p}$, $-P_{r5n}$. Further, the absolute value of the intermediate polarization $P_{i5}$ may be smaller than the absolute values of the remanent polarizations $P_{r3p}$, $-P_{r3n}$ of the hysteresis loop described above and with reference to FIG. 3B. The absolute value of the intermediate polarization $P_{i5}$ may also be smaller than the absolute values of the remanent polarizations $P_{r4p}$, $-P_{r4n}$ of the hysteresis loop described above and with reference to FIG. 4B.

In contrast to the hysteresis loop in the first polarization orientation state described above and with reference to FIG. 3B, in the hysteresis loop of the third polarization orientation state, as reflected in FIG. 5B, the upward polarization $P_{up}$ distributed in the second ferroelectric material layer 140 during the application of the positive electric field prevents, suppresses or impedes the switching of the polarization orientation of the first ferroelectric material layer 120 to the down polarization $P_{dn}$. Accordingly, the saturation electric field $E_{5p}$ at the positive bias of the hysteresis loop illustrated in FIG. 5B may be greater than the saturation electric field $E_{3p}$ at the positive bias of the hysteresis loop illustrated in FIG. 3B. However, in the hysteresis loop of FIG. 5B, the coercive electric fields $E_{c5p}$ and $-E_{c5n}$, may be substantially the same as the coercive electric fields $E_{c3p}$ and $-E_{c3n}$ of the hysteresis loop of FIG. 3B.

Figure 6A:
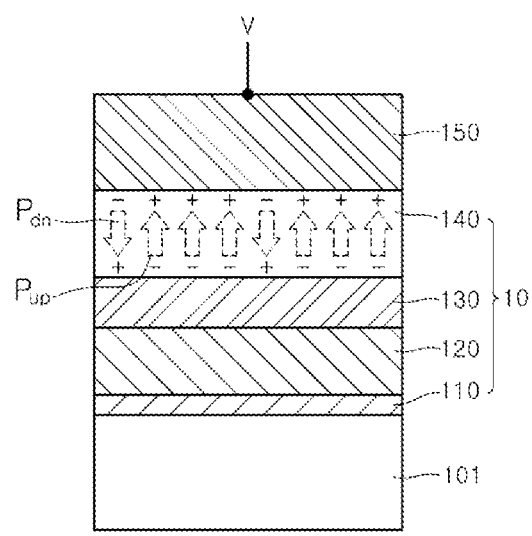

Referring to FIG. 6A, in an embodiment, a fourth write voltage may be applied to a ferroelectric structure 10 from a power supply V. The fourth write voltage changes the polarization orientation in the second ferroelectric material layer 140 to a fourth polarization state having both a fraction or portion of the layer in an upward polarization $P_{up}$ and a fraction or portion of the layer in a down polarization $P_{dn}$. However, in the fourth polarization orientation state, the fraction of the upward polarization $P_{up}$ may be greater than the fraction of the down polarization $P_{dn}$. As an example, in the fourth polarization state, the domain region having an orientation state of the upward polarization $P_{up}$ may be greater than a domain region having the orientation state of the down polarization $P_{dn}$ in the second ferroelectric material layer 140.

Figure 6B:
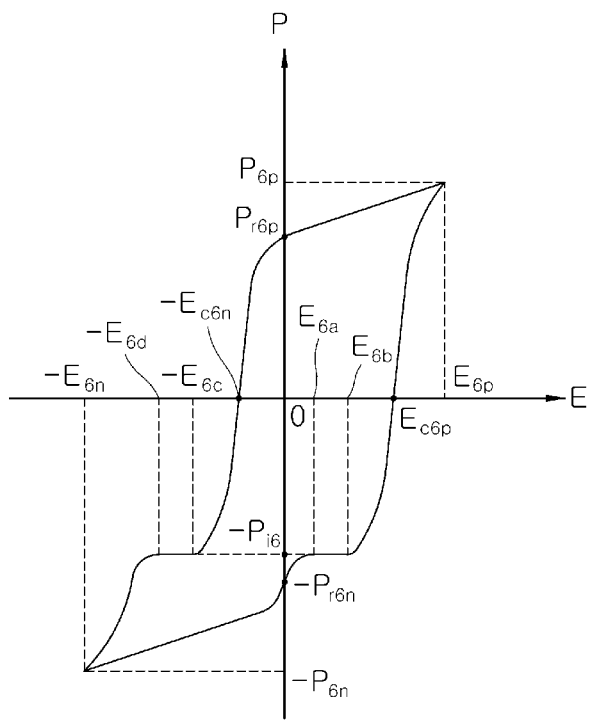

Referring to FIG. 6B, there is illustrated a hysteresis loop of the ferroelectric structure 10 having coercive electric fields $E_{c6p}$, $-E_{c6n}$ and remanent polarization $P_{r6p}$, $-P_{r6n}$. Saturation polarization $P_{6p}$, $-P_{6n}$ corresponding to the saturation electric fields $E_{6p}$, $-E_{6n}$ are illustrated on the hysteresis loop. When the second ferroelectric material layer 140 has the fourth polarization orientation state, the hysteresis loop of the ferroelectric structure 10 may not be symmetrical with respect to the origin.

Referring to FIG. 6B again, when a negative electric field with a value between $-E_{6c}$ and $-E_{6d}$ is applied, intermediate polarization $-P_{i6}$ may be generated. The absolute value of the intermediate polarization $-P_{i6}$ may be smaller than the absolute values of the remanent polarizations $P_{r6p}$, $-P_{r6n}$. Further, the absolute value of the intermediate polarization $-P_{i6}$ may be smaller than the absolute values of the remanent polarizations $P_{r3p}$, $-P_{r3n}$ of the hysteresis loop described above and with reference to FIG. 33 and the absolute values of the remanent polarizations $P_{r4p}$, $-P_{r4n}$ of the hysteresis loop described above with reference to FIG. 4B.

In contrast to the hysteresis loop in the second polarization orientation state described above and with reference to FIG. 4B, in the hysteresis loop of the fourth polarization orientation, as reflected in FIG. 6B, the downward polarization $P_{dn}$ distributed in the second ferroelectric material layer 140 during the application of a negative electric field prevents, suppresses or impedes the switching of the polarization orientation of the first ferroelectric material layer 120 to an upward polarization $P_{up}$. Accordingly, the absolute values of saturation electric fields $-E_{6n}$ in the negative electric field of the hysteresis loop illustrated in FIG. 6B may be greater than the absolute value of saturation electric field $-E_{4n}$ in the negative electric field of the hysteresis loop shown in FIG. 4B.

In an embodiment, an electric field interval $E_{6a}$ through $E_{6b}$ generating the intermediate polarization $-P_{i6}$ in the hysteresis loop of FIG. 6B may be substantially the same as an electric field interval $E_{5a}$ through $E_{5b}$ generating the intermediate polarization $P_{i5}$ in the hysteresis loop of FIG. 5B. However, the intermediate polarization $P_{i5}$ of the hysteresis loop of FIG. 5B and the intermediate polarization $-P_{i6}$ of the hysteresis loop of FIG. 6B may have different values from each other. In other words, different intermediate polarization may occur in the same electric field depending on the orientation state of the remanent polarization in the second ferroelectric material layer 140.

As described above, according to an embodiment of the present disclosure, a ferroelectric memory device 1 may include a ferroelectric structure 10 having first and second ferroelectric material layers 120 and 140 disposed between the substrate 101 and the gate electrode layer 150. The first and second ferroelectric material layers 120 and 140 may have different hysteresis loops. As an example, on a hysteresis loop, the absolute value of the coercive electric field of the second ferroelectric material layer 140 may be greater than the absolute value of the coercive electric field of the first ferroelectric material layer 120.

As described above, according to an embodiment, a write operation for a ferroelectric memory device 1 can control the remanent polarization orientation of a second ferroelectric material layer 140 and implement a plurality of levels of information by varying the write voltage applied to the gate electrode layer 150. In embodiments, the second ferroelectric material layer 140 may have the remanent polarization orientation illustrated in FIGS. 3A, 4A, 5A and 6A. Meanwhile, as a result of the write operation, the behavior of the hysteresis loop of the entire ferroelectric structure 10 may be changed depending on the state of the remanent polarization written in the second ferroelectric material layer 140.

In an embodiment, a read operation for the ferroelectric memory device 1 may be performed by applying a gate voltage to the gate electrode layer 150, by applying a read operation voltage between the source and drain regions and by reading a current between the source and drain regions. The gate voltage has a magnitude that does not change the remanent polarization orientation of the second ferroelectric material layer 140. Accordingly, the gate voltage may be less than the voltage corresponding to the coercive electric field $E_{c2}$ of the second hysteresis loop 220 corresponding to a second ferroelectric material layer 140 in FIG. 2.

In an embodiment, it is possible to discriminate a plurality of levels of logic information stored in the ferroelectric memory device 1 by applying a gate voltage corresponding to an electric field in the range of $E_{5a}$ to $E_{5b}$ of the hysteresis loop illustrated in FIG. 5B or an electric field in the range of $E_{6a}$ to $E_{bb}$ of the hysteresis loop illustrated in FIG. 6B, and measuring the different intermediate polarizations $P_{i5}$ and $-P_{i6}$. Although, two intermediate polarizations $P_{i5}$ and $-P_{i6}$ are described above and with reference to FIGS. 3A to 6A and FIGS. 3B to 6B, the intermediate polarization is not limited thereto. Depending on the state of the remanent polarization orientation in the second ferroelectric material layer 140, the ferroelectric structure 10 may be implemented with a plurality, and at least two, of intermediate polarization values.

In an embodiment of the present disclosure, a read operation does not change the remanent polarization orientation stored in the second ferroelectric material layer 140, such that the remanent polarization orientation of the second ferroelectric material layer 140 can be reliably maintained. As a result, it is possible to provide a ferroelectric memory device 1 that can stably store a plurality of levels of logic information.

Figure 7:
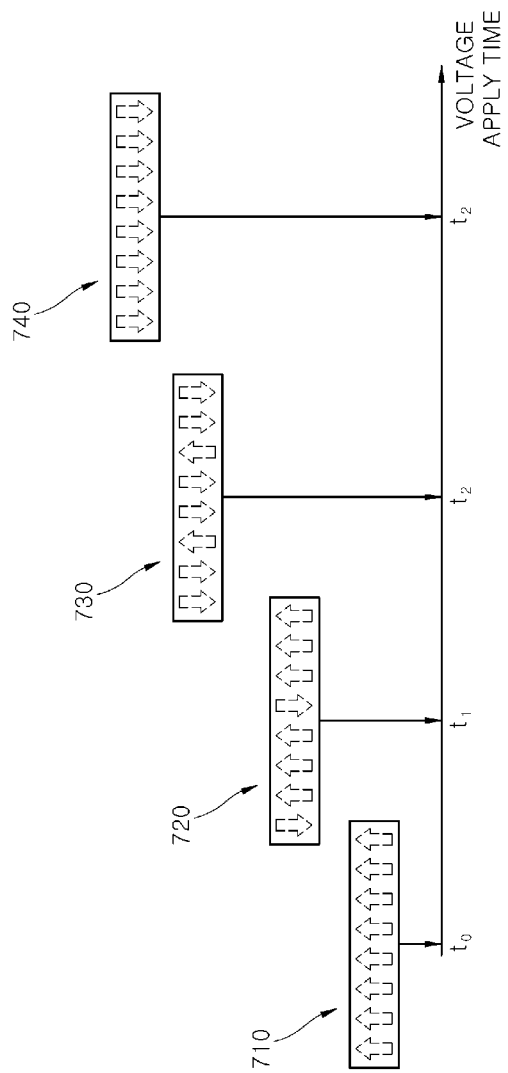
FIG. 7 is a view schematically illustrating a write operation for a ferroelectric memory device according to an embodiment of the present disclosure.

FIG. 7 is a view schematically illustrating a write operation for a ferroelectric material layer according to an embodiment of the present disclosure. The ferroelectric material layer may correspond to the second ferroelectric material layer 140 of the ferroelectric memory element 1 described above and with reference to FIG. 1.

FIG. 7 schematically illustrates the remanent polarization orientation of the second ferroelectric material layer 140 according to a write operation. In an embodiment, a voltage corresponding to a negative electric field having an absolute value equal to or greater than the absolute value of the second saturation electric field $-E_{n2}$ of the second hysteresis loop 220 of FIG. 2 may be applied to the second ferroelectric material layer 140. Thus, the remanent polarization can be oriented to an upward polarization Pup throughout the second ferroelectric material layer 140.

Referring to state 710 of FIG. 7, a first write voltage corresponding to a positive electric field equal to or greater than the first saturation electric field $E_{p2}$ of the second hysteresis loop 220 of FIG. 2 may be applied at a first time $t_0$. The first time $t_0$ may be limited such that the upward polarization $P_{up}$ is not switched to the downward polarization $P_{dn}$. The state 710 may correspond to the orientation state of the remanent polarization of the second ferroelectric material layer 140 described above and with reference to FIG. 4A.

Next, referring to state 720 of FIG. 7, a second write voltage of the same polarity and magnitude as the first write voltage is applied over a the time period increasing to a second time $t_1$. Accordingly, a portion of the upward polarization $P_{up}$ in the second ferroelectric material layer 140 may be switched to the downward polarization $P_{dn}$. The state 720 may correspond to the orientation state of the remanent polarization of the second ferroelectric material layer 140 described above and with reference to FIG. 6A.

Next, referring to state 730 of FIG. 7, a third write voltage having the same polarity and magnitude as the first write voltage is applied over a time period increasing to a third time t2. Accordingly, a higher fraction of the upward polarization $P_{up}$ in the second ferroelectric material layer 140 can be switched to the downward polarization $P_{dn}$. The state 730 may correspond to the orientation state of the remanent polarization of the second ferroelectric material layer 140 described above with and reference to FIG. 5A.

Next, referring to state 740 of FIG. 7, a fourth write voltage having the same polarity and magnitude as the first write voltage is applied over a time period increasing to a fourth time $t_3$. Accordingly, any remaining upward polarization $P_{up}$ of the second ferroelectric material layer 140 can all be switched to the down polarization $P_{dn}$. The state 740 may correspond to the orientation state of the remanent polarization of the second ferroelectric material layer 140 described above and with reference to FIG. 3A.

As described above, the write operation for a plurality of levels of information for the second ferroelectric material layer 140 according to an embodiment can be performed. The write operation can be achieved by applying a voltage corresponding to an electric field equal to or greater than the saturation electric field of the second ferroelectric substance layer 140, and adjusting the electric field application time.

The embodiments of the inventive concept have been disclosed above for illustrative purposes. Those of ordinary skill in the art will appreciate that various modifications, additions and substitutions are possible, without departing from the scope and spirit of the inventive concept as disclosed in the accompanying claims.

What is claimed is:

1. A ferroelectric memory device comprising:
    a substrate;
    a ferroelectric structure disposed on the substrate, wherein the ferroelectric structure comprises
    a first ferroelectric material layer disposed on the substrate,
    an electrical floating layer disposed on the first ferroelectric material layer, and
    a second ferroelectric material layer disposed on the electrical floating layer; and
    a gate electrode layer disposed on the ferroelectric structure,
    wherein a hysteresis loop of the second ferroelectric material layer differs from a hysteresis loop of the first ferroelectric material layer, and
    wherein the first ferroelectric material layer, the electrical floating layer, the second ferroelectric material layer, and the gate electrode layer are sequentially stacked;
    wherein the first and second ferroelectric material layers each comprise the same metal oxide and each comprise one or more dopants, and
    wherein the one or more dopants of the first ferroelectric material layer differ from the one or more dopants of the second ferroelectric material layer;
    wherein the metal oxide comprises at least one of a hafnium oxide, a zirconium oxide, and a hafnium zirconium oxide; and
    wherein the electrical floating layer is disposed between the first ferroelectric material layer and the second ferroelectric material layer, and wherein only the first ferroelectric material layer contacts the substrate.

2. The ferroelectric memory device of claim 1, wherein the one or more dopants comprises at least one selected from a group consisting of carbon (C), silicon (Si), magnesium (Mg), aluminum (Al), yttrium (Y), nitrogen (N), germanium (Ge), tin (Sn), strontium (Sr), lead (Pb), calcium (Ca), barium (Ba), titanium (Ti), zirconium (Zr), gadolinium (Gd), and lanthanum (La).

3. The ferroelectric memory device of claim 1,
    wherein the first and second ferroelectric material layers each comprise a different metal oxide.

4. The ferroelectric memory device of claim 1,
    wherein a polarization orientation of the second ferroelectric material layer is adjusted from a first level corresponding to a first logic state to a second level corresponding to a second logic state by applying a predetermined write voltage applied to the gate electrode layer such that a write operation to the ferroelectric memory device is performed.

5. The ferroelectric memory device of claim 4,
    wherein the predetermined write voltage induces an electron distribution in the electrical floating layer that corresponds to the polarization orientation of the second ferroelectric material layer, and
    the electron distribution is applied to a polarization orientation of the first ferroelectric material layer.

6. The ferroelectric memory device of claim 1,
    wherein the ferroelectric structure further comprises an interfacial insulation layer disposed between the substrate and the first ferroelectric material layer.

7. The ferroelectric memory device of claim 1, further comprising
    a source region and a drain region disposed in the substrate at respective sides of the ferroelectric structure.

* * * * *